(12) United States Patent
Nakatani

(10) Patent No.: US 6,418,001 B1
(45) Date of Patent: Jul. 9, 2002

(54) TUNNELING MAGNETORESISTIVE ELEMENT USING A BIAS MAGNETIC FIELD

(75) Inventor: Ryoichi Nakatani, Toyonaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/467,729

(22) Filed: Dec. 20, 1999

(30) Foreign Application Priority Data

Dec. 21, 1998 (JP) .......................................... 10-362533

(51) Int. Cl.[7] ................................................. G11B 5/39
(52) U.S. Cl. ................................................. 360/324.2
(58) Field of Search ....................................... 360/324.2

(56) References Cited

U.S. PATENT DOCUMENTS

| 5,764,567 A | 6/1998 | Parkin | |
|---|---|---|---|
| 6,256,178 B1 * | 7/2001 | Gill | ........................ 360/324.2 |

FOREIGN PATENT DOCUMENTS

| JP | 64-13209 | 1/1989 |
| JP | 9-120510 | 5/1997 |
| JP | 9-251618 | 9/1997 |
| JP | 10-255231 | 9/1998 |
| JP | 11-134620 | 5/1999 |
| JP | 10-190090 | 7/1999 |

OTHER PUBLICATIONS

Physics Letters, vol. 54A, No. 3, Sep. 8, 1975, "Tunneling Between Ferromagnetic Films", M. Julliere, pp. 225–226.

* cited by examiner

Primary Examiner—Craig A. Renner
(74) Attorney, Agent, or Firm—Mattingly, Stanger & Malur, P.C.

(57) ABSTRACT

The present application provides a magneto-resistive element excellent in symmetry of playback waveforms. The basic construction of the present application is as follows. That is, a magnetic layer 13, an insulating layer 14, and a magnetic layer 15 are laminated; a power supply 18 for applying a voltage between two magnetic layers is provided; an anti-ferromagnetic layer 16 is laminated on the magnetic layer 15, direction of which magnetization is substantially parallel or counter-parallel with a detecting direction of an external magnetic field, and when the external magnetic field is not present, a power supply 17 for causing a current to flow in a non-magnetic metal layer 12 and in an inner direction of a layer surface thereof is provided so that a direction of magnetization of the magnetic layer 13 is substantially at right angles to the detecting direction of the external magnetic field; and there is provided a signal detector 19 for detecting a change of current tunneling through an insulating layer when the direction of magnetization of the magnetic layer 13 is changed by the external magnetic field.

5 Claims, 10 Drawing Sheets

TUNNELING MAGNETORESISTIVE ELEMENT USING A BIAS MAGNETIC FIELD

BACKGROUND OF THE INVENTION

1. Field of the Invention

The present invention relates to a magneto-resistive element used for a magnetic head, a magnetic field sensor or the like, a magnetic head using the magneto-resistive element, a magnetic recording apparatus (magnetic recording and playback apparatus), and a magnetic memory.

2. Description of the Related Art

A multi-layer indicating a magnetic tunneling phenomenon is reported in Physics Letters, vol. 54A (1975), No. 3, p. 225 by Jullier. With higher density of magnetic recording, as a future playback magnetic head, application of the multi-layer to a magneto-resistive type head has been studied.

The multi-layer comprises a laminate having a magnetic layer, an insulating layer, and a magnetic layer laminated in the order, and when an electron issued from one magnetic layer and tunneling through the insulating layer enters the other magnetic layer, a change occurs in the tunneling probability depending on the direction of magnetization of two magnetic layers. The change in the tunneling probability is observed as a magneto-resistance.

Where the conventional multi-layer is used for the magneto-resistive element, it is necessary, when an external magnetic field is not present, to make the direction of magnetization of a magnetic layer magnetized and rotated by the external magnetic field substantially at right angles to the detecting direction of the external magnetic field. This is necessary for the reason that symmetry of playback outputs when the magneto-resistive element is applied to the external magnetic field is better. However, a leakage magnetic field from the other magnetic layer is applied to the magnetic layer magnetized and rotated by the external magnetic field, and the direction of magnetization is not at right angles to the detecting direction of the external magnetic field. The leakage magnetic field from the other magnetic layer delicately changes due to the construction of the magneto-resistive element, the thickness of the magenta layer, the unevenness of the insulating layer, and so on, thus posing a problem that controlling the direction of magnetization of the magnetic layer is difficult.

It is a first object to provide a magneto-resistive element which is excellent in symmetry of playback waveforms.

It is a second object of the present invention to provide a magnetic head using such a magneto-resistive element as described.

It is a third object of the present invention to provide a magnetic recording apparatus using such a magnetic head as described.

It is a fourth object to provide a magnetic memory which is excellent in symmetry of playback waveforms.

SUMMARY OF THE INVENTION

For achieving the aforementioned first object, according to the present invention, there is provided a magneto-resistive element comprising, a multi-layer having a first magnetic layer, an insulating layer, and a second magnetic layer laminated on a substrate in said order, a means for applying a voltage between the first magnetic layer and the second magnetic layer, a direction of magnetization of one magnetic layer of the first magnetic layer and the second magnetic layer being substantially parallel or counter-parallel with a detecting direction of an external magnetic field, a control means for making a direction of magnetization of the other magnetic layer of the first magnetic layer and the second magnetic layer substantially at right angles to the detecting direction of an external magnetic field when the external magnetic field is not present, and a means for detecting, when the direction of magnetization of the other magnetic layer is changed by the external magnetic field, a change of a current tunneling through the insulating layer caused thereby.

In the magnetic resistive element, if the direction of magnetization of the other magnetic layer is made completely at right angles to the detecting direction of the external magnetic field, playback waveforms are symmetrical, but if deviated from the right angles, the symmetry lowers. The substantially right angles termed herein means that if the non-symmetry of playback waveforms is in the range within 5%, the direction may be deviated from the right angles. This deviation is for example, approximately ±5 depending on the shape of the playback waveform.

Further, the terms "a direction of magnetization of one magnetic layer being substantially parallel or counter-parallel with a detecting direction of an external magnetic field" herein means that a deviation in the range similar to the direction of magnetization of the other magnetic layer is allowed to be parallel or counter-parallel. The same is true for the following description.

In the electro-resistive element, an anti-ferromagnetic layer is laminated on one magnetic layer, and the anti-ferromagnetic layer and one magnetic layer are subjected to magnetic exchange coupling to make the direction of magnetization of one magnetic layer substantially parallel or counter-parallel with the detecting direction of the external magnetic field.

In this case, as the control means, there can be provided a means for causing a current to flow in an inner direction of a layer surface of at least one layer of the anti-ferromagnetic layer and a crystal orientation control layer. Further, as the control means, there can be provided a means for causing a current to flow in an inner direction of a layer surface of the other magnetic layer, and a means for causing a current to flow in an inner direction of a layer surface of a non-magnetic metal layer laminated on a multi-layer.

Further, coercive force of one magnetic layer is made higher than that of the other magnetic layer, without providing the anti-ferromagnetic layer, and as the control means, there can be provided a means for causing a current to flow in an inner direction of a layer surface of a non-magnetic metal layer laminated on a multi-layer. Further, likewise, coercive force of one magnetic layer is made higher than that of the other magnetic layer, being arranged on a substrate and there is provided with a means for causing a current to flow in an inner direction of a layer surface of one magnetic layer.

Further, for achieving the aforementioned first object, according to the present invention, there is provided a magneto-resistive element comprising, a multi-layer having a first magnetic layer, a first insulating layer, a second magnetic layer, a second insulating layer, and a third magnetic layer laminated on a substrate in said order, a means for applying a voltage between the first magnetic layer and the third magnetic layer, a direction of magnetization of one magnetic layer of a set of the first and third magnetic layers and the second magnetic layer being substantially parallel or counter-parallel with a detecting direction of an external magnetic field, a control means for making a direction of magnetization of the other magnetic layer of the set of the first and third magnetic layers and the second magnetic layer substantially at right angles to the detecting direction of the external magnetic field when the external magnetic field is not present, and a means for detecting, when the direction of magnetization of the other magnetic layer is changed by the external magnetic field, a change of a current tunneling through the insulating layer caused thereby.

As the control means, there can be provided a means for making coercive force of one magnetic layer higher than that of the other magnetic layer, laminating a non-magnetic metal layer on a multi-layer, and causing a current to flow in an inner direction of a layer surface of the non-magnetic metal layer.

Further, anti-ferromagnetic layers are provided on both sides of a multi-layer, one magnetic layer comprising a set of the first and third magnetic layer, and as the control means, there can be provided a means for causing a current to flow in an inner direction of a layer surface of at least one layer of the anti-ferromagnetic layer and a crystal orientation control layer laminated on the side opposite to on the side in which a multi-layer of one of the anti-ferromagnetic layers is arranged.

Further, for achieving the aforementioned first object, according to the present invention, there is provided a magneto-resistive element comprising, a multi-layer having a hard magnetic layer, a non-magnetic metal layer, a first soft magnetic layer, an insulating layer, a second soft magnetic layer, and an anti-ferroemagnetic layer laminated on a substrate in said order from the side closer to the substrate, a means for applying a voltage between the first soft magnetic layer and the second magnetic layer, the anti-ferromagnetic layer and the second soft magnetic layer being subjected to magnetic exchange coupling, a direction of magnetization of the second soft magnetic layer being substantially parallel or counter-parallel with a detecting direction of an external magnetic field by the exchange coupling, and a direction of magnetization of the first soft magnetic layer being made substantially at right angles to the detecting direction of an external magnetic field when the external magnetic field is not present, and a means for detecting, when the direction of magnetization of the first soft magnetic layer is changed by the external magnetic field, a change of a current tunneling through the insulating layer caused thereby.

Further, for achieving the aforementioned second object, according to the present invention, there is provided a magnetic head comprising a magneto-resistive type head for read, and an induction type head for write, the magneto-resistive element described in any one of the foregoing being used as the magneto-resistive type head.

Further, for achieving the aforementioned third object, according to the present invention, there is provided a magnetic recording apparatus comprising a magnetic recording medium, a magnetic head provided in correspondence with a recording surface of the magnetic recording medium, a driving unit for a magnetic recording medium, a driving unit for a magnetic head, and a recording and playback signal processing system, the afore-mentioned magnetic head (in the second object) being used as said magnetic head.

Further, for achieving the aforementioned third object, according to the present invention, there is provided a magnetic memory comprising a magneto-resistive element according to Embodiments 1, 2, 3 or 4 described later of the aforementioned magneto-resistive elements, and a magnetic field generating mechanism for directing a direction of magnetization of one magnetic layer at the desired direction. The magnetic memory may be provided with a means for heating a magneto-resistive element.

As described above, according to the present invention, a magneto-resistive element using a multi-layer in which two or three magnetic layers are separated by an insulating layer is used, an induction magnetic field is applied to a rotating magnetic layer magnetized by an external magnetic field, and the induction magnetic field applied to the magnetic layer is offset by a leakage magnetic field from a magnetic layer with magnetization fixed, as a result of which the magnetization of the magnetic layer is substantially at right angles to the magnetic field applying direction to thereby provide an excellent symmetry of playback waveforms.

DETAILED DESCRIPTION OF THE PREFERRED EMBODIMENTS

Figure 1:
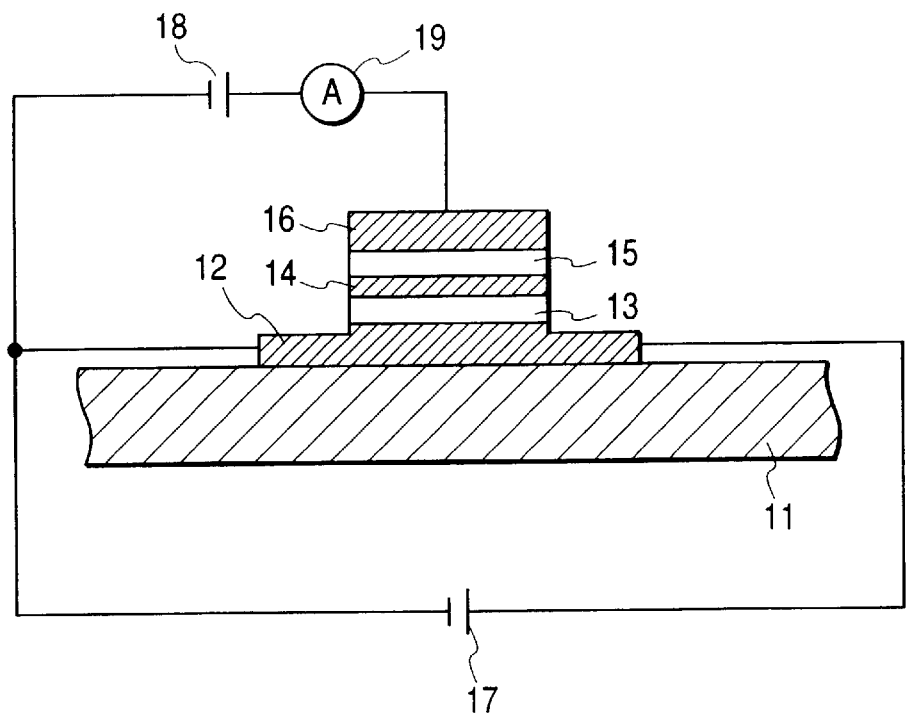
FIG. 1 is a sectional construction view of a magneto-resistive element according to Embodiment 1 of the present invention.

Before explaining some concrete embodiments, some useful modes of the invention are showed as follows:

The first mode of the present invention is a magnetic head having a magneto-resistive element, said magneto-resistive element comprising: a substrate, a multi-layer having at least a first magnetic layer, an insulating layer, and a second magnetic layer laminated on said substrate, a voltage supplier applying a voltage between the first magnetic layer and the second magnetic layer; a direction of magnetization of one magnetic layer selected from a group of the first and the second magnetic layers being substantially parallel or counter-parallel with a detecting direction of an external magnetic field; a direction of magnetization of the other magnetic layer, which is not substantially parallel or counter-parallel with the detecting direction of the external magnetic field, being changeable by said external magnetic field, a controller being a controller causing a current to flow in at least one conductive layer selected from a group of layers laminated on said substrate in a direction crossing a laminating direction of said multi-layer and perpendicular to the external magnetic field; the controller being for making a direction of magnetization of the other magnetic layer, which is changeable by said external magnetic field, substantially perpendicular to the detecting direction of the external magnetic field when the external magnetic field is not present, and a detector detecting, when the direction of magnetization of the other magnetic layer is changed by the external magnetic field, a change of current tunneling through the insulating layer caused thereby.

Typical measures for making a direction of magnetization of one magnetic layer selected from the first and the second magnetic layers substantially parallel or counter parallel with a detecting direction of an external magnetic field are as follows:

As stated before, at first, one is an anti-ferromagnetic layer formed adjacent to a magnetic layer of the multi-layer. The anti-magnetic ferromagnetic layer and the magnetic layer are subjected to magnetic exchange coupling to make the direction of magnetization of the magnetic layer substantially parallel or counter-parallel with the detecting direction of the external magnetic field.

The second, it is to make coercive force of one magnetic layer of the multi-layer higher than coercive force of the other magnetic layer of the multi-layer.

Therefore, the second mode of this invention is a magnetic head having a magneto-resistive element, said magneto-resistive element comprising: a substrate, a multi-layer having at least a first magnetic layer, an insulating layer, and a second magnetic layer laminated on said substrate, an anti-ferromagnetic layer being formed on lower or upper of said multi-layer, a voltage supplier applying a voltage between the first magnetic layer and the second magnetic layer; a direction of magnetization of one magnetic layer selected from a group of the first and the second magnetic layers being substantially parallel or counter-parallel with a detecting direction of an external magnetic field; a direction of magnetization of the other magnetic layer, which is not substantially parallel or counter-parallel with the detecting direction of the external magnetic field, being changeable by said external magnetic field, a controller being a controller causing a current to flow in at least one conductive layer selected from a group of layers laminated on said substrate in a direction crossing a laminating direction of said multi-layer and perpendicular to the external magnetic field; the controller being for making a direction of magnetization of the other magnetic layer, which is changeable by said external magnetic field, substantially perpendicular to the detecting direction of the external magnetic field when the external magnetic field is not present, and a detector detecting, when the direction of magnetization of the other magnetic layer is changed by the external magnetic field, a change of current tunneling through the insulating layer caused thereby.

The anti-ferromagnetic layer is able to be formed on said substrate, and at that time the multi-layer is formed on the anti-ferromagnetic layer. Moreover the multi-layer is also able to be formed on the substrate, and at this time the anti-ferromagnetic layer is formed on the multi-layer.

The third, a magnetic head having a magneto-resistive element, said magneto-resistive element comprising: a substrate, a multi-layer having at least a first magnetic layer, an insulating layer, and a second magnetic layer laminated on said substrate, coercive force of one magnetic layer selected from a group of the first magnetic layer and the second magnetic layer being higher than coercive force of the other magnetic layer selected from the group of the first magnetic layer and the second magnetic layer, a voltage supplier applying a voltage between the first magnetic layer and the second magnetic layer; a direction of magnetization of one magnetic layer selected from a group of the first and the second magnetic layers being substantially parallel or counter-parallel with a detecting direction of an external magnetic field; a direction of magnetization of the other magnetic layer, which is not substantially parallel or counter-parallel with the detecting direction of the external magnetic field, being changeable by said external magnetic field, a controller being a controller causing a current to flow in at least one conductive layer selected from a group of layers laminated on said substrate in a direction crossing a laminating direction of said multi-layer and perpendicular to the external magnetic field; the controller being for making a direction of magnetization of the other magnetic layer, which is changeable by said external magnetic field, substantially perpendicular to the detecting direction of the external magnetic field when the external magnetic field is not present, and a detector detecting, when the direction of magnetization of the other magnetic layer is changed by the external magnetic field, a change of current tunneling through the insulating layer caused thereby.

Coercive force of either of (or any one of) the magnetic layers of the multi-layer is able to be higher than that of the other magnetic layer.

The controller is a controller causing a current to flow in at least one conductive layer selected from a group of layers laminated on said substrate in a direction crossing a laminating direction of said multi-layer. In other words, the current flows in a direction of the laminated layer surface. The direction of the current of the controller crosses a direction of tunnel current tunneling through the insulating layer.

And the controller is also for making a direction of magnetization of the other magnetic layer, which is changeable by said external magnetic field, substantially perpendicular to the detecting direction of the external magnetic field.

At least the conductive layer to flow the current is able to be employed from a group of several conductive layers formed on the substrate. That is, for example, it is the first magnetic layer, the second magnetic layer, anti-ferromagnetic layer, non-magnetic metal layer, or a crystal orientation layer. The non-magnetic metal layer, and the crystal orientation layer are described hereafter. It is more preferable that the conductive layer for the current is selected from conductive layers being nearer the substrate in order to realize an aim of the present invention. In case of using both a crystal orientation layer and a non-magnetic metal layer, for example, both layers are employed as conductive layers for a controller.

The other mode of this invention is a magnetic head wherein at least one layer selected from a group a crystal orientation layer and a non-magnetic metal layer is formed between said multi-layer and said substrate. And the other mode of this invention is a magnetic head, wherein a non-magnetic metal layer is formed on said multi-layer.

EMBODIMENT 1

As shown in FIG. 1, layers of a non-magnetic metal layer 12, a magnetic layer 13, an insulating layer 14, a magnetic layer 15, and an anti-ferromagnetic layer 16 are formed on a substrate 11 in the order. The non-magnetic metal layer 12 is formed of Zr of thickness 20 nm, the magnetic layers 13 and 15 formed of a layer having a thickness of 5 nm and made from an Ni-20 at %Fe alloy, and the insulating layer 14 of oxide of Al of thickness 1.3 nm. The anti-ferromagnetic layer 16 is formed of a layer having a thickness of 10 nm and made from an Mn-22 at %Ir alloy. A voltage is applied between the non-magnetic metal layer 12 and the anti-ferromagnetic layer 16 from a power supply 18. That is, a potential difference is generated in the magnetic layers 13 and 15 on both ends of the insulating layer 14. A current tunnels through the insulating layer 14 due to the potential difference. The tunnel current is detected by a signal detector 19.

When the directions of magnetization of the magnetic layers 13 and 15 are parallel, the maximum tunnel current flows, and when the directions of magnetization of the magnetic layers 13 and 15 are counter-parallel, the minimum tunnel current flows. In the present embodiment, an applied voltage is 0.05 V. While in the present embodiment, the power supply 18 is connected to the anti-ferromagnetic layer 16 and the non-magnetic metal layer 12, it is to be noted that since a potential difference will suffice to occur between the magnetic layers 13 and 15, the power supply 18 can be connected to the magnetic layers 13 and 15 directly. A current can be flown in the non-magnetic metal layer 12 by the power supply 17. A current causes to flow in the non-magnetic metal layer 12 to thereby generate an induction magnetic field, and a magnetic field can be applied to the magnetic layer 13 adjacent to the non-magnetic metal layer 12. The magnitude of the magnetic field is in proportion to a current amount.

Figure 2A:
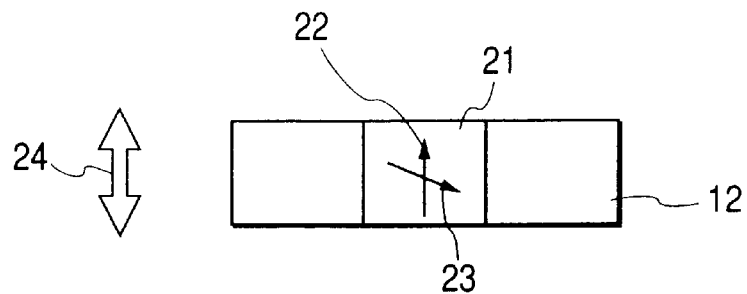
FIGS. 2A to 2C are schematic views for explaining the operating principle of a magneto-resistive element according to Embodiment 1 of the present invention.
Figure 2B:
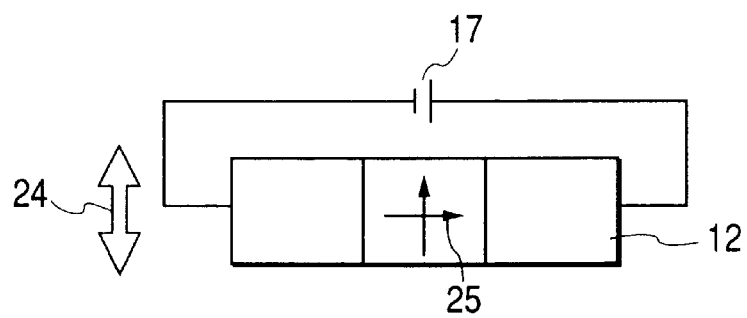
Figure 2C:
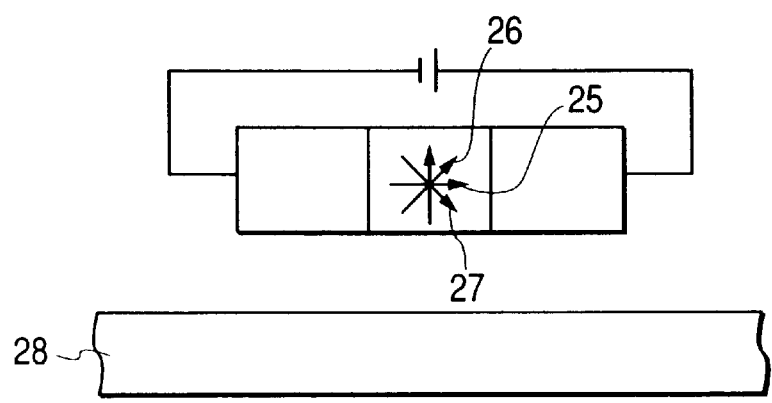

FIG. 2A to 2C are schematic views of a multi-layer as viewed from top. As shown in FIG. 2A, a direction 22 of magnetization of a magnetic layer 15 of a multi-layer 21 is fixed to a direction in the figure. This is because the anti-ferromagnetic layer 16 is in contact with the magnetic layer 15. The direction 22 of magnetization of the magnetic layer 15 is parallel or counter-parallel with a detecting direction 24 of an external magnetic field. When a current does not flow in the non-magnetic metal layer 12, a direction 23 of magnetization of the magnetic layer 13 in FIG. 1 is directed at a direction as in FIG. 2. The direction 23 of magnetization is determined according to a leakage magnetic field from the magnetic layer 15 and magnetic anisotropy of the magnetic layer 13 in FIG. 1. The direction 23 of magnetization is not at right angles to the detecting direction 24 of an external magnetic field.

As shown in FIG. 2B, a current causes to flow in the non-magnetic metal layer 12 by a power supply 17. The current is 5 µA. As a result, an induction magnetic field is applied to the magnetic layer 13, and a direction of magnetization of the magnetic layer 13 is directed as shown in the figure. The direction 25 of magnetization is substantially at right angles to the detecting direction 24 of the external magnetic field. This is because the induction magnetic field is offset by magnetic fields other than the induction magnetic field applied to the magnetic layer 13.

Further, as shown in FIG. 2C, a magnetic recording medium 28 causes to move closer to the magneto-resistive element. A magnetic field is applied to the magnetic layer 13 in FIG. 1 by a leakage magnetic field from the magnetic recording medium 28. When the leakage magnetic field from the magnetic recording medium is directed upward, a direction 26 of magnetization of the magnetic layer 13 is directed at a direction shown in FIG. 2C. On the other hand, when the leakage magnetic field from the magnetic recording medium is directed downward, a direction 27 of magnetization of the magnetic layer 13 is directed at a direction shown in FIG. 2C.

Figure 3:
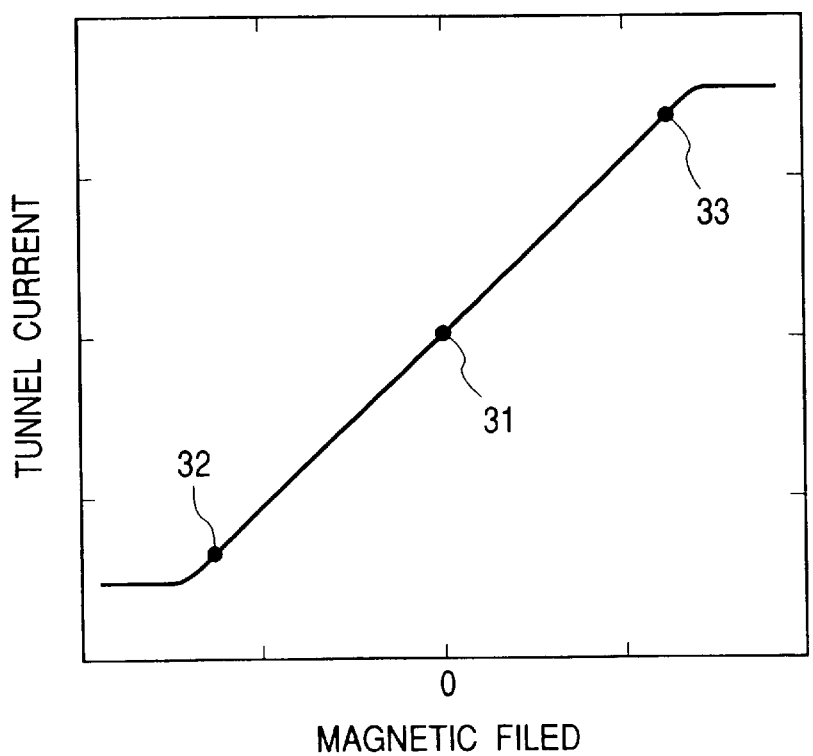
FIG. 3 is a view showing a relationship between an external magnetic field and a tunnel current in the magneto-resistive element according to the present invention.

A change of a tunnel current tunneling through the insulating layer 14 is schematically shown in FIG. 3. In the figure, when the leakage magnetic field from the magnetic recording medium is directed upward, a magnetic field having a positive value is applied to the multi-layer. When the leakage magnetic field from the magnetic recording medium is not applied to the magnetic layer 13 in FIG. 1, a value of the tunnel current is "31" in FIG. 3. Where the direction of magnetization of the magnetic layer 13 is substantially at right angles to the detecting direction 24 of the external magnetic field, "31" in FIG. 3 is positioned substantially in the center in the range of a change of the tunnel current. Since the leakage magnetic field from the magnetic recording medium is directed downward, the direction of magnetization of the magnetic layer 13 is "27" shown in FIG. 2C, the tunnel current lowers to assume a value of "32" in FIG. 3. This is because the direction of magnetization of the magnetic layer 13 and the direction of magnetization of the magnetic layer 15 are close to counter-parallel.

Where the leakage magnetic field from the magnetic recording medium is directed upward and the height thereof is the same as that of the above-described downward direction case, the tunnel current increases to assume a value of 33 in FIG. 3. This is because the direction of magnetization of the magnetic layer 13 and the direction of magnetization of the magnetic layer 15 are close to parallel. The change amount from the tunnel current 31 is substantially the same in absolute value at "32" and "33". This is because the direction of magnetization of the magnetic layer 13 when a leakage magnetic field from the magnetic recording medium is not present is substantially at right angles to the detecting direction 24 of the external magnetic field. Where a magnetic field from the magnetic recording medium in a different direction of the same height is applied, when the absolute value of the change amount from the tunnel current is substantially the same, playback waveforms are substantially symmetrical. In other words, the symmetry of the playback waveforms lowers unless the direction of magnetization of the magnetic layer 13 when the leakage magnetic field from the magnetic recording medium is not present is not at right angles to the detecting direction 24 of the external magnetic field. In the magnetic recording playback apparatus, the symmetry of the playback waveforms comprises an important problem, and preferably, non-symmetry of playback waveforms is within 5%.

Therefore, it is necessary to make the direction of magnetization of the magnetic layer 13, when the leakage magnetic field from the magnetic recording medium is not present, substantially at right angles to the detecting direction 24 of the external magnetic field.

Figure 4A:
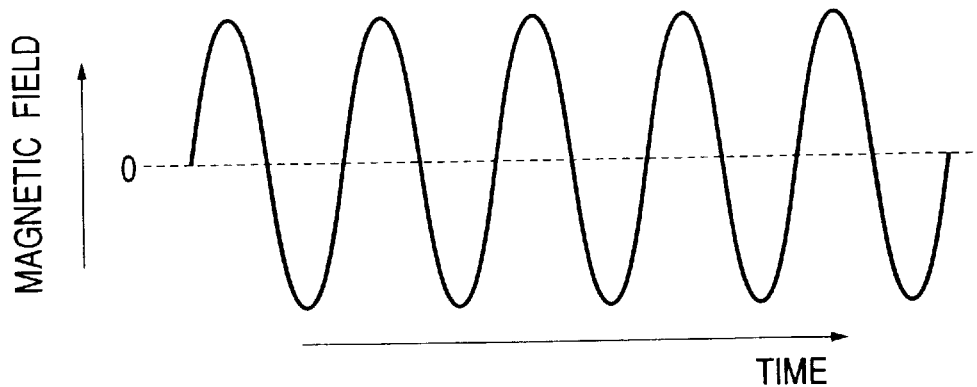
FIG. 4 is a view showing an applied magnetic field and a playback waveform in the magneto-resistive elements of the present invention and the prior art.
Figure 4B:
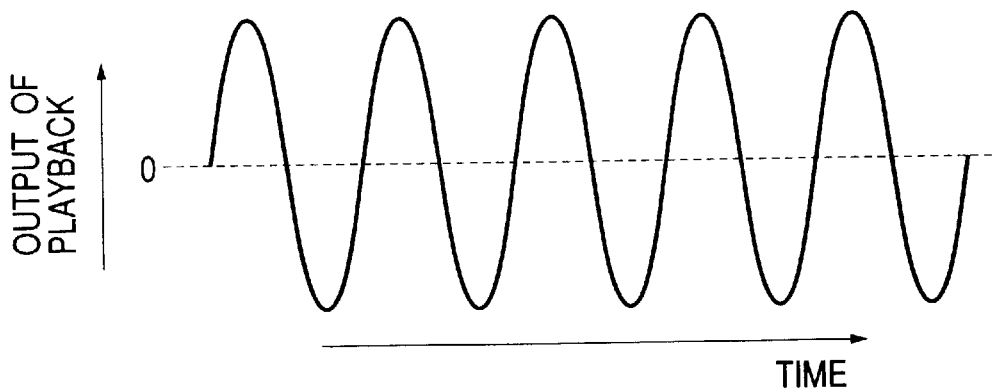
Figure 4C:
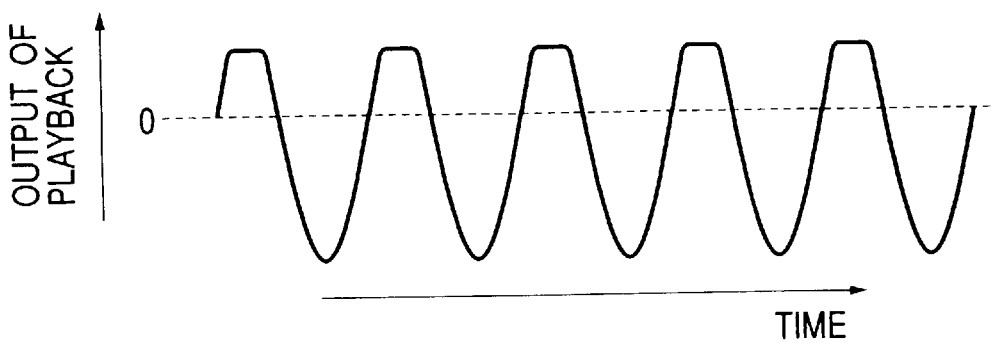

FIG. 4A to 4C show the symmetry of playback waveforms as described above. When a magnetic field which varies with time as shown in FIG. 4A is applied to the magneto-resistive element of the present invention, a playback output thereof shows a waveform excellent in symmetry as shown in FIG. 4B. On the other hand, where a current causes not to flow in the non-magnetic layer 12, and the direction of magnetization of the magnetic layer 13 is not controlled, the playback waveform is asymmetrical as shown in FIG. 4C.

While in the present embodiment, the direction of magnetization of the magnetic layer 15 has been parallel or counter-parallel to the direction of the external magnetic field, a slight deviation of angle is allowed unless the symmetry of playback waveforms gets out. Likewise, also with respect to the direction of magnetization of the magnetic layer 13, a slight deviation of angle is allowed unless the symmetry of playback waveforms gets out.

While in the present embodiment, Zr is used as a material for the non-magnetic metal layer 12, other non-magnetic metals can be also used. Further, while an Ni—Fe based alloy is used as a material for a magnetic layer, other magnetic materials can be also used. As other materials for a magnetic layer, a metal material having a low coercive force is preferable. While an Mn—Ir based alloy is used as a material for an anti-ferromagnetic layer, other conductive anti-ferromagnetic layer materials may be used. The magneto-resistive element type head shown in the present embodiment has no recording ability. Accordingly, for carrying out recording and playback, it is necessary to combine it with a recording induction type magnetic head for use.

In the magneto-resistive element according to the present embodiment, since the rate of change of magnetic resistance of a multi-layer is high, it is possible to apply a magneto-resistive element type head which is advantageous for playback of information on the magnetic recording medium recorded with high density. The magneto-resistive type head is a typical example of an application of a magneto-resistive element. However, since the magneto-resistive element of the present invention represents high playback output and excellent symmetry of playback waveforms, it is also suitable as a magnetic field sensor. This magnetic field sensor can be used for a rotary encoder or the like.

EMBODIMENT 2

Figure 5:
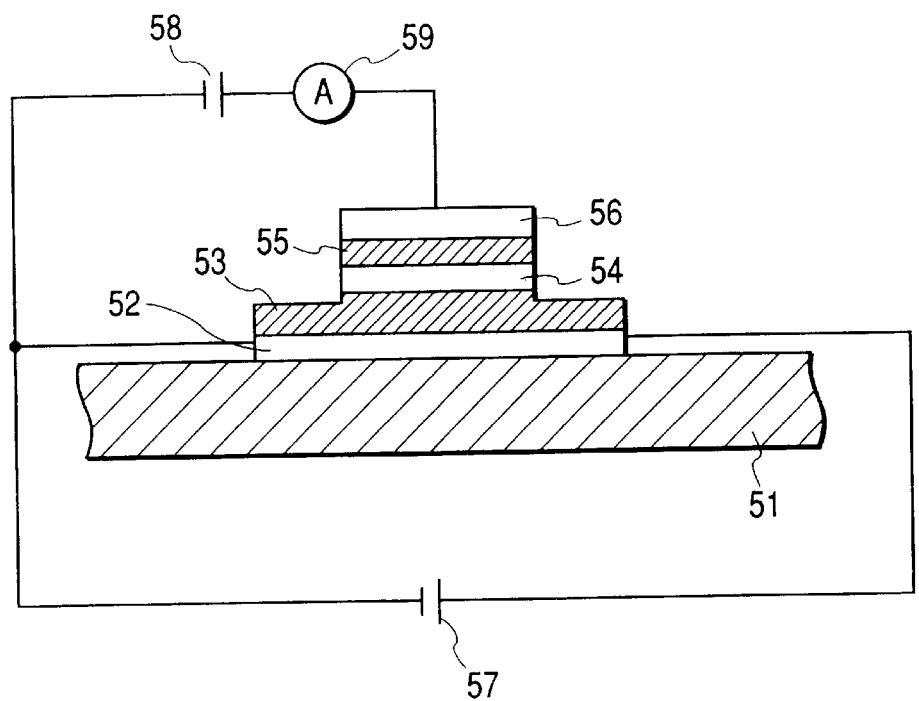
FIG. 5 is a sectional construction view of a magneto-resistive element according to Embodiment 2 of the present invention.

As a multi-layer having a function similar to Embodiment 1, a magneto-resistive element using a multi-layer shown in FIG. 5 is formed. As shown in FIG. 5, layers of a crystal orientation control layer 52, an anti-ferromagnetic layer 53, a magnetic layer 54, an insulating layer 55, and a magnetic layer 56 are formed on a substrate 51 in the order. Cu having a thickness of 10 nm is used for the crystal orientation control layer 52, a layer having a thickness of 10 nm and made from an Mn-22 at %Ir alloy used for the anti-ferromagnetic layer 53, and a layer having a thickness of 5 nm and made from an Ni-20 at %Fe alloy used for the magnetic layers 54 and 56, respectively. An oxide of Al of thickness 1.3 nm is used for the insulating layer 55. A voltage is applied between the crystal orientation control layer 52 and the magnetic layer 56 by a power supply 58. That is, a potential difference occurs between the magnetic layers 54 and 56 on both ends of the insulating layer 55. A current tunneling through the insulating layer 55 is detected by a signal detector 59.

An applied voltage in the present embodiment is 0.05 V. In the present embodiment, the power supply 58 is connected to the crystal orientation control layer 52 and the magnetic layer 56, but a potential difference will suffice to occur between the magnetic layers 54 and 56, and the power supply 58 may be connected to the magnetic layers 54 and 56 directly.

A part of the non-magnetic metal layer 12 in Embodiment 1 is borne by the crystal orientation control layer 52 and the anti-ferromagnetic layer 53. A current can be flown in the crystal orientation control layer 52 and the anti-ferromagnetic layer 53 by the power supply 57. A current is flown in the crystal orientation control layer 52 and the anti-ferromagnetic layer 53 whereby an induction magnetic field is generated to enable an application of a magnetic field to the magnetic layer 56. The height of the magnetic field is in proportion to a current amount. Accordingly, the direction of magnetization of the magnetic layer 56 can be controlled and made at right angles to the detecting direction of the external magnetic field by a current flowing in the crystal orientation control layer 52 and the anti-ferromagnetic layer 53.

While in the present embodiment, an Ni—Fe based alloy is used as a material for a magnetic layer, other magnetic materials can be also used. As the other materials for a magnetic layer, a metal material having a low coercive force is preferable. While an Mn—Ir based alloy is used as a material for an anti-ferromagnetic layer, other conductive anti-ferromagnetic layer materials may be used. For the crystal orientation control layer 52, a material having a face centered cubic construction of other metal systems may be used. The magneto-resistive element type head shown in the present embodiment has no recording ability. Accordingly, it is necessary for carrying out recording and playback to use it in combination with a recording induction type magnetic head.

EMBODIMENT 3

Figure 6:
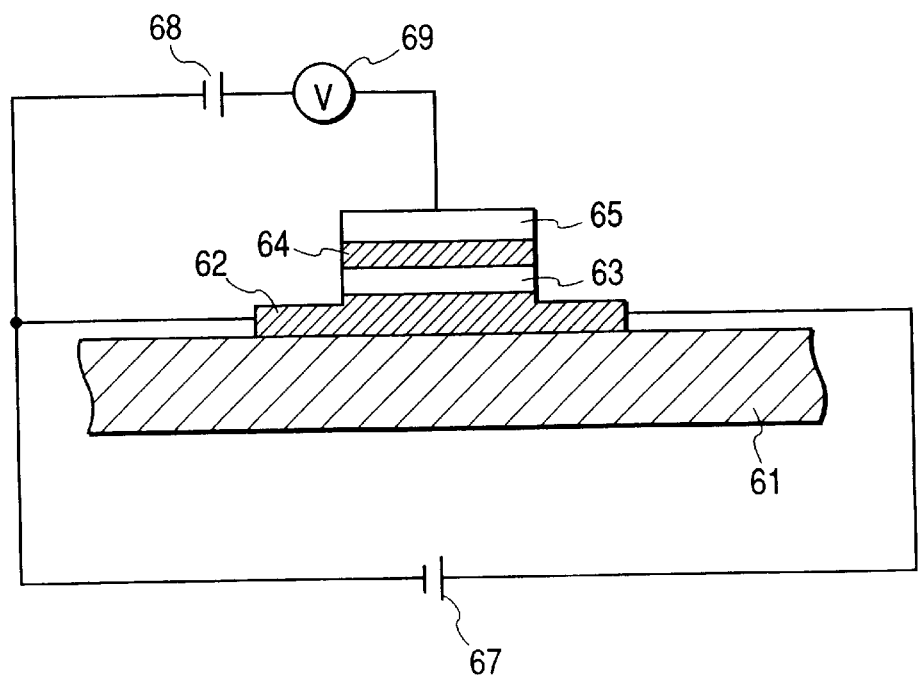
FIG. 6 is a sectional construction view of a magneto-resistive element according to Embodiment 3 of the present invention.

As a multi-layer having a function similar to Embodiment 1, a magneto-resistive element using a multi-layer shown in FIG. 6 is formed. As shown in FIG. 6, layers of a non-magnetic metal layer 62, a magnetic layer 63, an insulating layer 64, and a magnetic layer 65 are formed on a substrate 61 in the order. Zr having a thickness of 20 nm is used for the non-magnetic metal layer 62, a layer having a thickness of 5 nm and made from an Ni-20 at %Fe alloy used for the magnetic layer 63, and a layer having a thickness of 8 nm and made from a Co-17 at %Pt alloy used for the magnetic layer 65, respectively.

A coercive force of the magnetic layer 65 is higher than that of the magnetic layer 63, and is substantially parallel or counter-parallel to the detecting direction of the external magnetic field. Accordingly, in the low magnetic field, the direction of magnetization of the magnetic layer 65 having a relatively high coercive force is not rotated. On the other hand, the direction of magnetization of the magnetic layer 63 having a relatively low coercive force is rotated by the external magnetic field. An oxide of Al of thickness 1.3 nm is used for the insulating layer 64. A voltage is applied between the non-magnetic metal layer 62 and the magnetic layer 65 by a power supply 68. That is, a potential difference occurs between the magnetic layers 63 and 65 on both ends of the insulating layer 64. A current tunneling through the insulating layer 64 is detected by a signal detector 69. An applied voltage in the present embodiment is 0.05 V. A current can be flown in the non-magnetic metal layer 62 by a power supply 67. A current is flown in the non-magnetic metal layer 62 whereby an induction magnetic field occurs, and a magnetic field can be applied to the magnetic layer 63. The height of the magnetic field is in proportion to a current amount. Accordingly, the direction of magnetization of the magnetic layer 63 can be controlled and made at right angles to the detecting direction of the external magnetic field by a current flowing in the non-magnetic metal layer 62.

While in the present embodiment, a material having a relatively low coercive force is used for the magnetic layer 63, and a material having a relatively high coercive force is used for the magnetic layer 65. Even if a material having a relatively high coercive force is used for the magnetic layer 63, and a material having a relatively low coercive force is used for the magnetic layer 65, similar results can be obtained. In such a case as described, a current can be also flown in the magnetic layer having a relatively high coercive force to generate an induction magnetic field without providing a non-magnetic metal layer.

In the present embodiment, Zr was used as a material for the non-magnetic metal layer 62, but other non-magnetic metals can be also used. An Ni—Fe based alloy is used as a material for a magnetic layer having a low coercive force, but other magnetic materials having a low coercive force can be also used. Further, a Co—Pt based alloy is used as a material for a magnetic layer having a high coercive force, but other magnetic materials having a high coercive force can be also used. An Mn—Ir based alloy is used as a material for an anti-ferromagnetic layer, but other conductive anti-ferromagnetic materials can be also used.

The magneto-resistive element type head shown in the present embodiment has no recording ability similar to Embodiment 1. Accordingly, it is necessary for carrying out recording and playback to use it in combination with a recording induction type magnetic head.

EMBODIMENT 4

Figure 13:
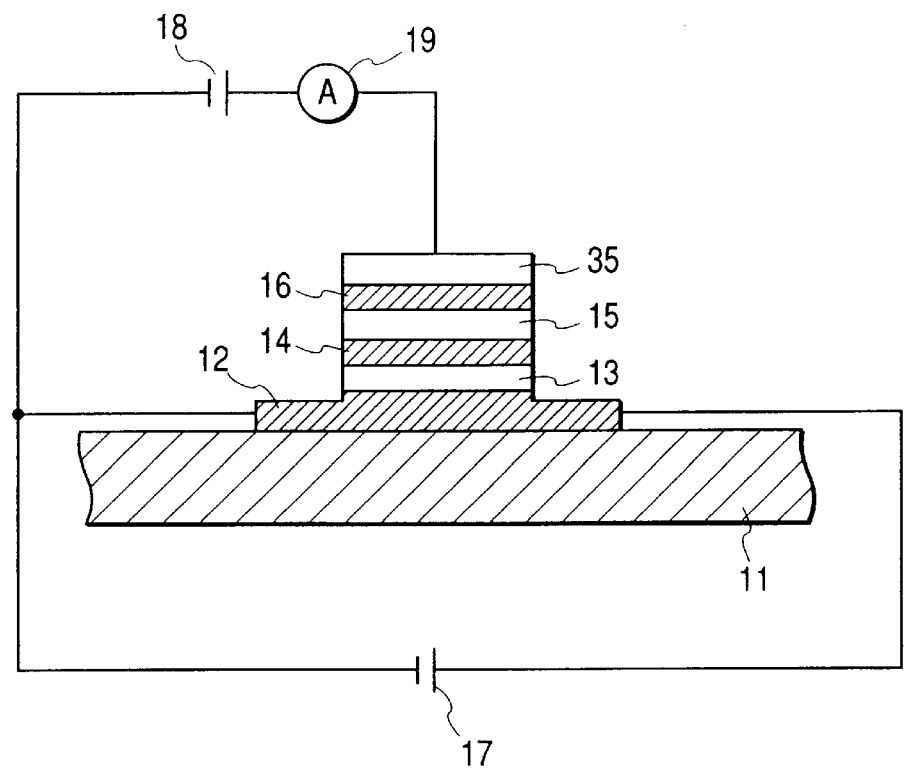
FIG. 13 is a sectional construction view of a magneto-resistive element according to Embodiment 4 of the present invention.
Figure 14:
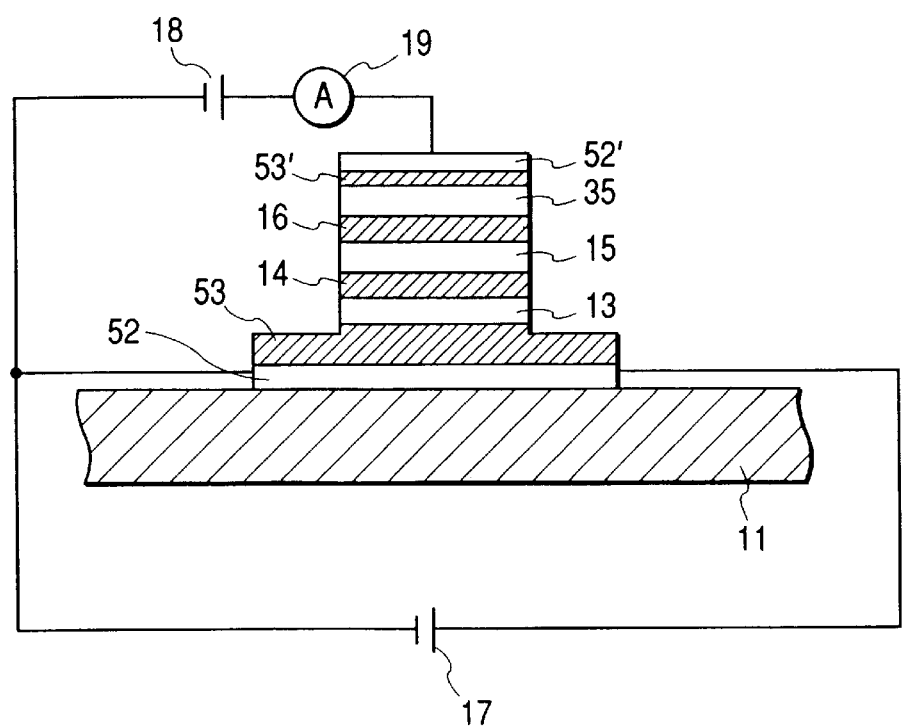
FIG. 14 is a sectional construction view of a magneto-resistive element according to Embodiment 4 of the present invention.

As the multi-layer having a function similar to Embodiment 1, a multi-layer having three magnetic layers and two insulating layers can be also applied. FIG. 13 and FIG. 14 are sectional construction views of a magneto-resistive element according to Embodiment.

In the present embodiment, a multi-layer is laminated on a non-magnetic metal layer in order of a first magnetic layer, an insulating layer, a second magnetic layer, an insulating layer, and a third magnetic layer. In a relatively low external magnetic field, a direction of magnetization of the first magnetic layer and the third magnetic layer is parallel or counter-parallel with the detecting direction of the external magnetic field. To this end, a high coercive force material may be used for the first magnetic layer and the third magnetic layer. Further, it is necessary that the direction of magnetization of the second magnetic layer is changed by the external magnetic field detected. To this end, a low coercive force material may be used for the second magnetic layer. The direction of magnetization of the second magnetic layer when the external magnetic field is not present is directed at right angles to the detecting direction of the external magnetic field by the induction magnetic field generated by causing a current to flow in the non-magnetic metal layer, similar to Embodiment 1. A voltage is applied between the first magnetic layer and the third magnetic layer, similar to Embodiment 1. As such a multi-layer as described, there can be mentioned, for example, in FIG. 13, Co—Pt (10 nm):35/Al—O:16 (1.3 nm)/Ni—Fe:15 (10 nm)/Al—O:14 (1.3 nm)/Co—Pt:13 (10 nm)/Zr:12 (10 nm).

Further, the construction of the multi-layer comprises Ni—Fe (10 nm)/Al—O (1.3 nm)/Co—Pt (10 nm)/Al—O (1.3 nm)/Ni—Fe (10 nm)/Zr (10 nm), and in a relatively low external magnetic field, a direction of magnetization of the Co—Pt layer as the second magnetic layer is parallel or counter-parallel with the detecting direction of the external magnetic field. The magnetic layer magnetized and rotated by the external magnetic field comprises the Ni—Fe layer as the first magnetic layer and the third magnetic layer. Accordingly, the direction of magnetization of the Ni—Fe layer when the external magnetic field is not present is directed at right angles to the detecting direction of the external magnetic field by the induction magnetic field generated by causing a current to flow in the Zr layer as the non-magnetic metal layer.

Another example of the multi-layer shown in FIG. 14 is as follows: In a multi-layer having the construction of Mn—Ir:52'(10 nm)/Ni—Fe:53 (10 nm)/Al—O:35 (1.3 nm)/ Ni—Fe:15 (10 nm)/Al—O:14 (1.3 nm)/Ni—Fe:13 (10 nm)/ Mn—Ir:53 (10 nm)/Cu:52 (10 nm), in a relatively low external magnetic field, magnetization of the Ni—Fe layer as the first magnetic layer and the third magnetic layer is fixed by the Mn—Ir anti-ferromagnetic layer, and the direction of magnetization of the Ni—Fe layer as the second magnetic layer is changed by the external magnetic field detected. A current is caused to flow in the Cu layer and the Mn—Ir layer as a crystal orientation control layer to generate an induction magnetic field, and when the external magnetic field is not present, magnetization of the Ni—Fe layer as the second magnetic layer is directed at right angles to the detecting direction of the external magnetic field.

EMBODIMENT 5

Figure 10:
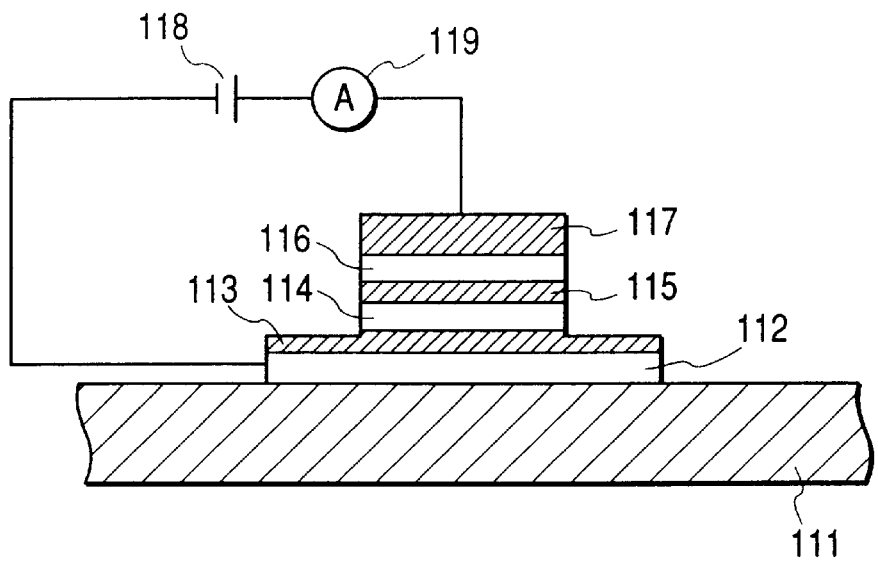
FIG. 10 is a sectional construction view of a magneto-resistive element according to Embodiment 5 of the present invention.

As shown in FIG. 10, layers of a hard magnetic layer 112, a non-magnetic metal layer 113, a soft magnetic layer 114, an insulating layer 115, a soft magnetic layer 116, and an anti-ferromagnetic layer 117 are formed on a substrate 111 in the order. The non-magnetic metal layer 113 magnetically separates the hard magnetic layer 112 and the soft magnetic layer 114. A layer having a thickness of 5 nm and made from a Co-17 at %Pt alloy is used for the hard magnetic layer 112, Zr of thickness 10 nm used for the non-magnetic metal layer 113, a layer having a thickness of 5 nm and made from an Ni-20 at %Fe alloy used for the soft magnetic layers 114 and 116, and an oxide of Al of thickness 1.3 nm used for the insulating layer 115, respectively. A layer having a thickness of 10 nm and made from an Mn-22 at %Ir alloy is used for the anti-ferromagnetic layer 117. A voltage is applied between the hard magnetic layer 112 and the anti-ferromagnetic layer 117 by a power supply 118. That is, a potential difference occurs between the soft magnetic layers 114 and 116 on both ends of the insulating layer 115. A current tunnels through the insulating layer 115 due to the potential difference. A tunnel current is detected by a signal detector 119. When a direction of magnetization of the soft magnetic layers 114 and 116 is parallel, the maximum tunnel current flows, and when a direction of magnetization of the soft magnetic layers 114 and 116 is counter-parallel, the minimum tunnel current flows.

In the present embodiment, an applied voltage is 0.05 V. In the present embodiment, the power supply 118 is connected to the anti-ferromagnetic layer 117 and the hard magnetic layer 112, but a potential difference will suffice to occur between the soft magnetic layers 114 and 116. The power supply 118 may be connected directly to the soft magnetic layers 114 and 116. Further, a magnetic field is generated from the hard magnetic layer 112, and a magnetic field can be applied to the soft magnetic layer 114.

Figure 11A:
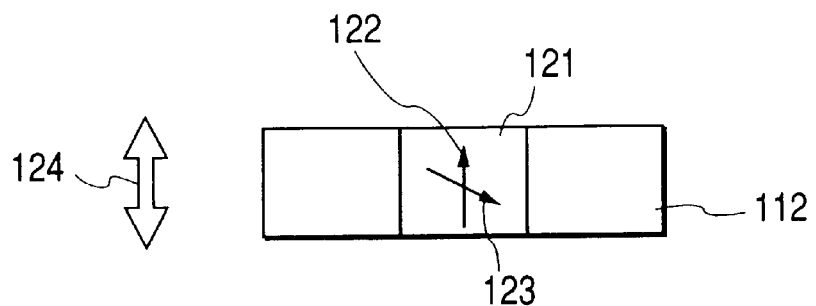
FIGS. 11A to 11C are schematic views for explaining the operating principle of a magneto-resistive element according to Embodiment 5 of the present invention.
Figure 11B:
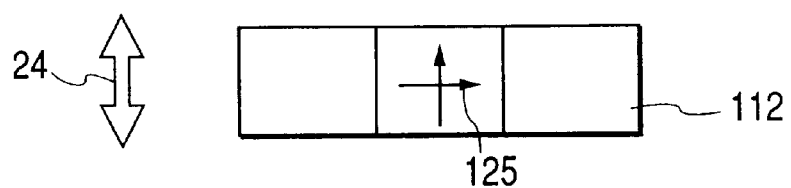
Figure 11C:
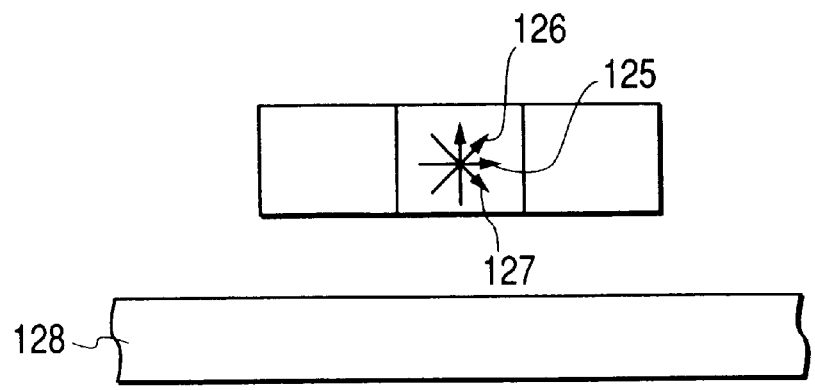

FIGS. 11A to 11C are schematic views of a multi-layer as viewed from top. A direction 122 of magnetization of the soft magnetic layer 116 in the multi-layer 121 is fixed to the direction as shown in the figure. This is because the anti-ferromagnetic layer 117 is in contact with the soft magnetic layer 116, as sown in FIG. 10. A direction 122 of magnetization of the soft magnetic layer 116 is parallel or counter-parallel with a detecting direction 124 of an external magnetic field. When the hard magnetic layer 112 is not magnetized, and the hard magnetic layer 112 is demagnetized, a unidirectional magnetic field is not generated from the hard magnetic layer 112. At this time, a direction 123 of magnetization of the soft magnetic layer 114 in FIG. 10 is directed at the direction shown in FIG. 11. The direction 123 of magnetization is determined according to a leakage magnetic field from the soft magnetic layer 116 and a magnetic anisotropy of the soft magnetic layer 114. This direction 123 of magnetization is not at right angles to the detecting direction 124 of the external magnetic field.

On the other hand, when the hard magnetic layer 112 is magnetized, a unidirectional magnetic field is generated from the hard magnetic layer 112. This magnetic field is offset by a magnetic field leaking from the soft magnetic layer 116. At this time, a direction 125 of magnetization of the soft magnetic layer 114 is directed as shown in FIG. 11B. The direction 125 of magnetization is substantially at right angles to the detecting direction 124 of the external magnetic field. This is because a leakage magnetic field from other magnetic layers applied to the soft magnetic layer 114 is offset.

Further, as shown in FIG. 11C, a magnetic recording medium 128 is moved closer. A magnetic field is applied to the soft magnetic layer 114 in FIG. 10 by a leakage magnetic field from the magnetic recording medium 128. When the leakage magnetic field from the magnetic recording medium is directed upward, a direction 126 of magnetization of the soft magnetic layer 114 is directed in a direction shown in FIG. 11C. Further, when the leakage magnetic field from the magnetic recording medium is directed downward, a direction 127 of magnetization of the soft magnetic layer 114 is directed in a direction shown in FIG. 11C.

Figure 12:
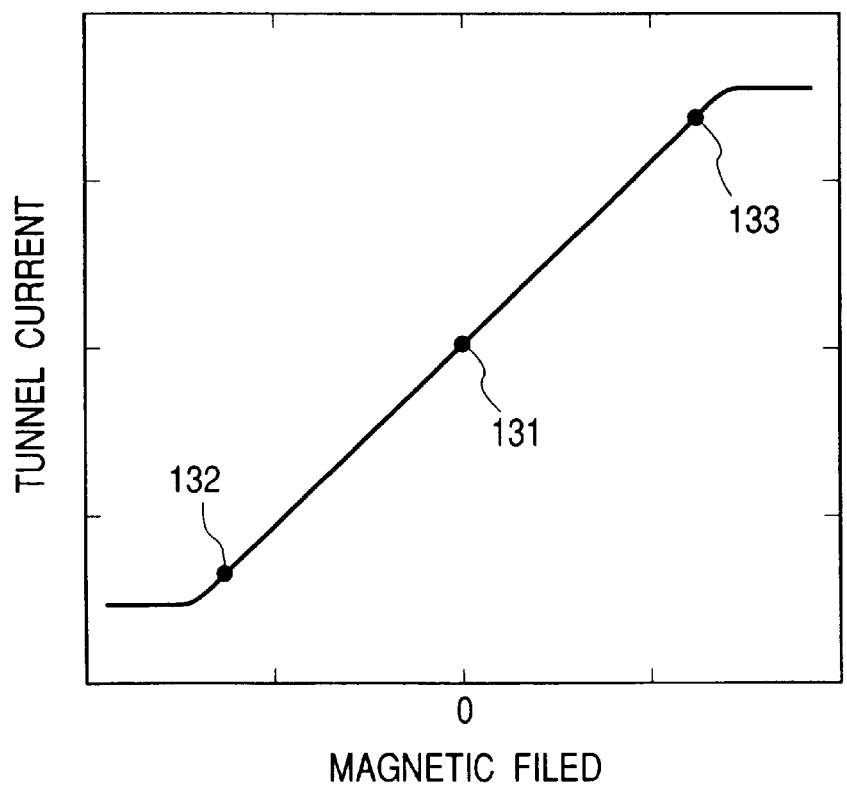
FIG. 12 is a view showing a relationship between an external magnetic field and a tunnel current in the magneto-resistive element according to the present invention.

A change of current tunneling through the insulating layer 115 at that time is shown schematically in FIG. 12. In the figure, when a leakage magnetic field from the magnetic recording medium is directed upward, a magnetic field of positive value is applied to a multi-layer. When the leakage magnetic field from the magnetic recording medium is not applied to the soft magnetic layer 114 in FIG. 10, the value of tunnel current is "131" in FIG. 12. Where the direction of magnetization of the soft magnetic layer 114 is substantially at right angles to the detecting direction 124 of the external magnetic field, "131" in FIG. 12 is positioned substantially in the center in the range of the change of the tunnel current.

When the leakage magnetic field from the magnetic recording medium is directed downward, a direction 127 of magnetization of the soft magnetic layer 114 is as shown in FIG. 11, and therefore, a tunnel current lowers to assume "132" in FIG. 12. This is because the direction of magnetization of the soft magnetic layer 114 and the direction of magnetization of the soft magnetic layer 116 approach counter-parallel.

Where the leakage magnetic field from the magnetic recording medium is directed upward, and the height thereof is the same as that of the above-described downward direction case, the direction 126 of magnetization of the soft magnetic layer 114 is as shown in FIG. 11, and therefore, a tunnel current increases to assume "133" in FIG. 12. This is because the direction of magnetization of the soft magnetic layer 114 and the direction of magnetization of the soft magnetic layer 116 approach parallel.

Change amounts from the tunnel current 131 are "132" and "133", absolute values of which are substantially the same. This is because the direction of magnetization of the soft magnetic layer 114 when a leakage magnetic field from the magnetic recording medium is not present is substantially at right angles to the detecting direction 124 of the external magnetic field. Where a magnetic field from the magnetic recording medium which are the same height and different in direction is applied, playback waveforms are substantially symmetrical when the absolute value of the change amount from the tunnel current 131 is substantially the same. In other words, unless the direction of magnetization of the soft magnetic layer 114 when the leakage magnetic field from the magnetic recording medium is not present is at right angles to the detecting direction 124 of the external magnetic field, the symmetry of playback waveforms lowers. In the magnetic recording playback apparatus, the symmetry of playback waveform comprises an important problem, and preferably, an asymmetry of playback waveforms is within 5%. To this end, it is necessary that the direction of magnetization of the soft magnetic layer 114 when the leakage magnetic field from the magnetic recording medium is not present is substantially at right angles to the detecting direction 124 of the external magnetic field.

While in the present embodiment, a Co—Pt based alloy is used as a material for the hard magnetic layer, other magnetic materials having a high coercive force can be also used. Further, Zr is used as a material for the non-magnetic metal layer 113, but other non-magnetic metals can be also used. Further, an Ni—Fe based alloy is used as a material for the soft magnetic layer, but other soft magnetic materials can be also used. As a material for the anti-ferromagnetic layer, an Mn—Ir based alloy is used. Other conductive anti-ferromagnetic materials can be also used. The magneto-resistive element type head shown in the present embodiment has no recording ability. Accordingly, it is necessary for carrying out recording and playback to use it in combination with the recording induction type magnetic head.

EMBODIMENT 6

Figure 7A:
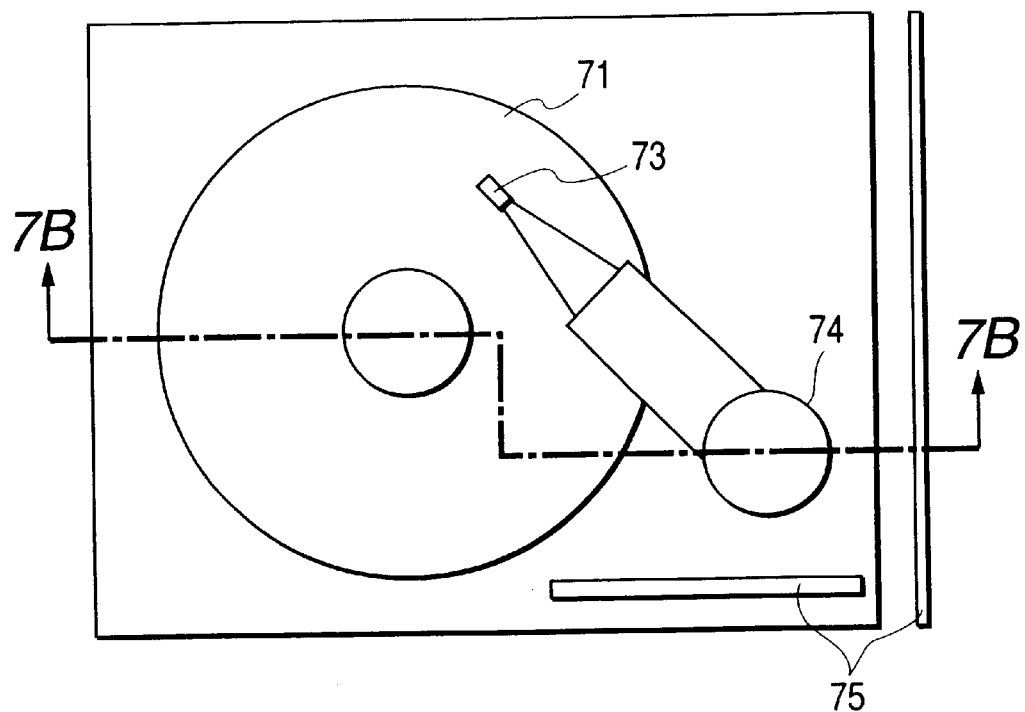
FIGS. 7A and 7B are respectively a plan view and a sectional view of a magnetic disk according to one embodiment of the present invention.
Figure 7B:
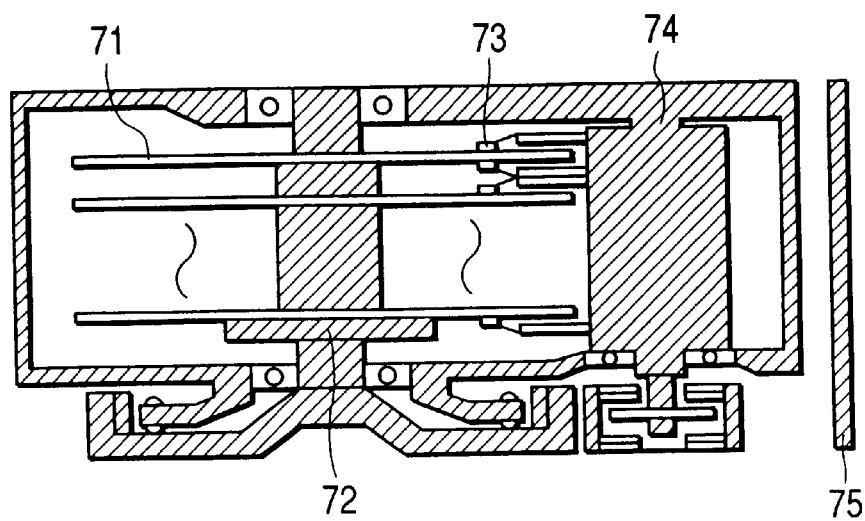

A magnetic disk device was prepared using the magneto-resistive type head mentioned in Embodiment 1. A plan view of the magnetic disk device and a sectional view taken on line AA' are shown in FIGS. 7A and 7B, respectively. For a magnetic recording medium 71 rotated by a magnetic recording medium driving force 72, a material comprising a Co—Cr based alloy is used. Track width of a magnetic head 73 held by the magnetic head driving force 74 is 1 $\mu$m. In the figure, numeral 75 designates a recording and playback processing system.

In the magnetic recording and playback apparatus using the magneto-resistive type head of the present invention, a high output playback signal was observed. An asymmetry of playback waveforms was about 2%. This is because magnetization of a magnetic layer magnetized and rotated by a leakage magnetic field from the magnetic recording medium is substantially perpendicular to the magnetic field applying direction when a magnetic field from the magnetic recording medium is not applied. In order that magnetization of the magnetic layer is made substantially perpendicular to the magnetic field applying direction, a current amount flowing in a non-magnetic metal layer may be controlled, and magnetization of the magnetic layer can be made substantially perpendicular to the magnetic field applying direction by a simple circuit. If the current amount flowing in the non-magnetic metal layer is controlled according to the characteristic of a magneto-resistive element in each magnetic recording and playback apparatus, it is possible to easily obtain a magnetic recording and playback apparatus which is excellent in symmetry of playback waveforms.

While in the present embodiment, the multi-layer mentioned in Embodiment 1 was used, even the magneto-resistive type heads using the multi-layer described in Embodiments 2 to 5, the similar result was obtained.

EMBODIMENT 7

Figure 8A:
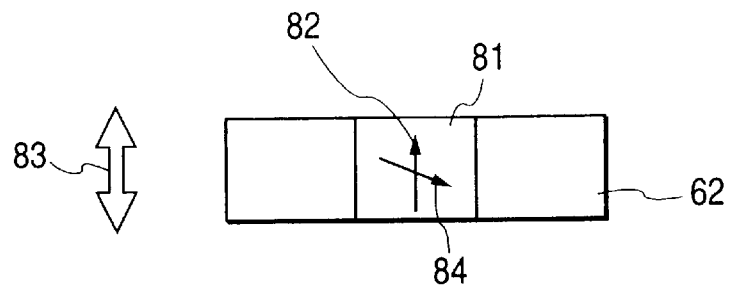
FIGS. 8A, 8B and 8C are schematic views for explaining the operating principle of a magnetic memory according to one embodiment of the present invention.

A magnetic memory was prepared using the magneto-resistive element according to the present invention mentioned in Embodiment 3. That is, the multi-layer shown in FIG. 6 was used. As mentioned in Embodiment 3, in FIG. 6, the direction of magnetization of the magnetic layer 65 having a relatively high coercive force is not rotated in the low magnetic field. On the other hand, the direction of magnetization of the magnetic layer 63 having a relatively low coercive force is rotated by the external magnetic field. A direction of magnetization when no current flows in the non-magnetic metal layer 62 is shown in FIG. 8A. As shown in the figure, a direction 82 of magnetization of a magnetic layer having a relatively high coercive force in a multi-layer 81 is fixed. The direction 82 of magnetization is parallel or counter-parallel with the direction 83 of an external magnetic field applied when information of the magnetic memory is read.

As shown, a direction 84 of magnetization of a magnetic layer having a relatively low coercive force is not at right angles to the direction 82 of magnetization of the magnetic layer having a relatively high coercive force. This is because a leakage magnetic field from the magnetic layer having a relatively high coercive force is applied to the magnetic layer having a relatively low coercive force. With respect to a relation of the direction of magnetization shown in FIG. 8A, even if an external magnetic field is applied when information of the magnetic memory is read, the symmetry of waveforms read is poor, similar to the case of the aforementioned magneto-resistive type head.

Figure 8B:
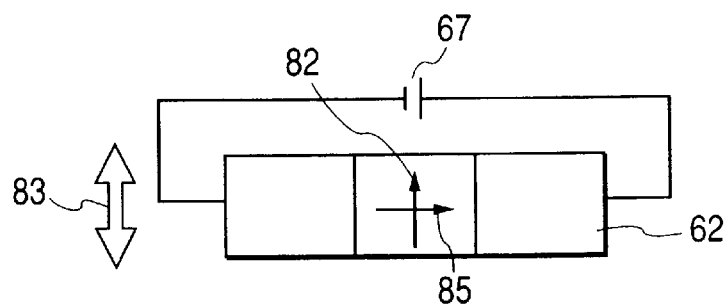

On the other hand, when, as shown in FIG. 8B, an induction magnetic field is generated by flowing current in a non-magnetic metal layer 62 by a power supply 67 and a magnetic field is applied to a multi-layer 81, a direction 85 of magnetization of a magnetic layer having a relatively low coercive force is directed in a direction shown. This is at right angles to the direction 82 of magnetization of a magnetic layer having a relatively high coercive force. With respect to a relation of the direction of magnetization shown in FIG. 8B, where an external magnetic field is applied when information of the magnetic memory is read, the symmetry of waveforms read is good, similar to the case of the aforementioned magneto-resistive type head.

Figure 8C:
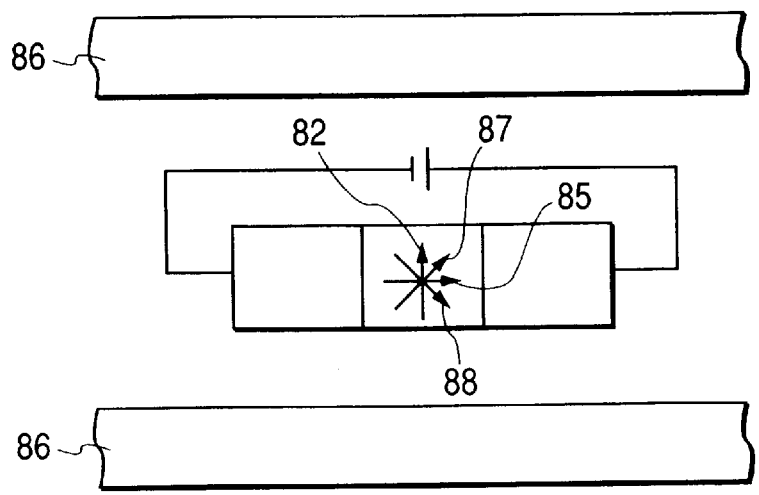
Figure 9:
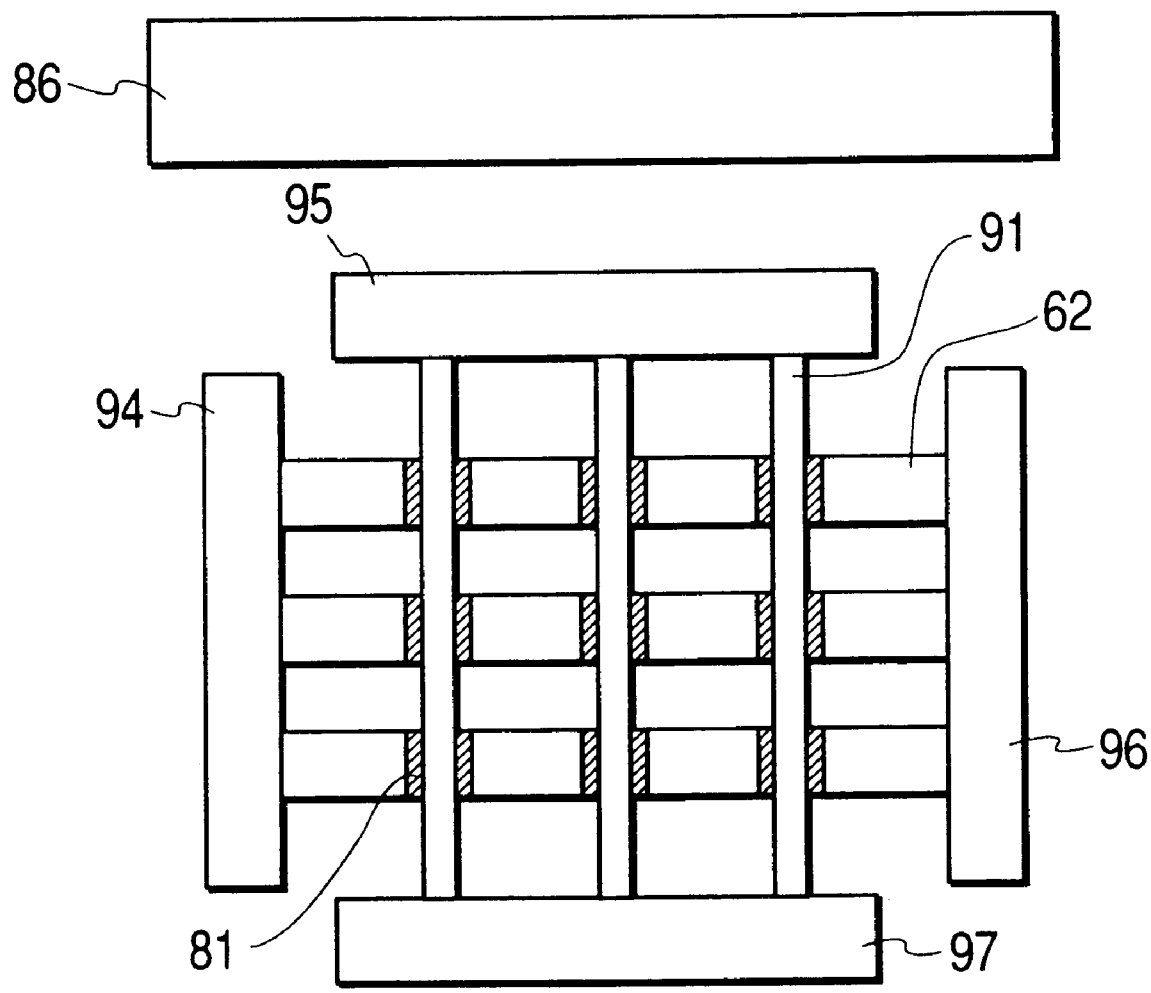
FIG. 9 is a schematic view for explaining the schematic construction of a magnetic memory according to one embodiment of the present invention.

FIG. 9 is a schematic view for explaining the schematic construction of a magnetic memory according to one embodiment of the present invention. As shown in FIG. 8C, a magnetic field is applied to a multi-layer by a pair of magnetic field generating mechanisms 86. By applying the magnetic field, when a direction 87 of magnetization of a magnetic layer having a relatively low coercive force is directed as shown, a current tunneling through an insulating layer increases, and when a direction 88 of magnetization of a magnetic layer having a relatively low coercive force is directed as shown, a current tunneling through an insulating layer reduces, then it is understood that the direction 82 of magnetization of a magnetic layer having a relatively high coercive force is directed as shown. On the other hand, by applying the magnetic field, when the direction 87 of magnetization of a magnetic layer having a relatively low coercive force is directed as shown, a current tunneling through an insulating layer reduces, and when the direction 88 of magnetization of a magnetic layer having a relatively low coercive force is directed as shown, a current tunneling through an insulating layer reduces, then it is understood that the direction 82 of magnetization of a magnetic layer having a relatively high coercive force is directed opposite to that as shown.

As described above, if, when a magnetic field is applied to a multi-layer by the pair of magnetic field generating mechanisms 86, a current tunneling through the insulating layer is measured, the direction of magnetization of a magnetic layer having a relatively high coercive force is found. Accordingly, if the direction of magnetization of a magnetic layer having a relatively high coercive force is a recording medium, it can be used as a magnetic memory.

Recording was carried out, as shown in FIG. 9, by causing a current to flow in a non-magnetic metal layer 62 below a multi-layer 81 and a non-magnetic metal layer 91 above the multi-layer 81 to thereby generate a magnetic field, and changing a direction of a magnetic layer having a relatively high coercive force. That is, in the playback, this is utilized also when recording the non-magnetic metal layer 62 for causing a current to flow in order to control the direction of a magnetic layer having a relatively low coercive force. Likewise, in the playback, this is utilized also when recording a non-magnetic metal layer 91 for making use it as a conductor for measuring a current tunneling through an insulating layer. A recording current is controlled by current application and measuring systems 94, 95, 96 and 97. Where a coercive force of a magnetic layer is high and a recording current is short, it is effective that a multi-layer is heated, and the coercive force of the magnetic layer is lowered. For heating, preferably, there is employed a method for drawing a laser beam by an optical system to irradiate it against the multi-layer.

In the playback, the non-magnetic metal layer 62 for connecting between the current application and measuring systems 94 and 96 or the non-magnetic metal layer 91 for connecting between the current application and measuring systems 95 and 97 is selected, and a current tunneling through the insulating layer in a multi-layer at a point of intersection therebetween is measured. As described above, a magnetic field is applied to the multi-layer by the pair of magnetic field generating mechanisms 86 in the measurement.

While in the present invention, the magneto-resistive element mentioned in Embodiment 3 is used, even if the magneto-resistive elements mentioned in Embodiments 1, 2 or 4 are used, a magnetic memory device can be likewise constituted.

For better understanding of the accompanying drawings, description of various reference numerals will be listed as follows:

11, 51, 61, 111 . . . substrate, 12, 62, 91, 113 . . . 10 non-magnetic metal layer, 13, 15, 54, 56, 63, 65 . . . magnetic layer, 14, 55, 65, 115 . . . insulating layer, 16, 53, 117 . . . anti-ferromagnetic layer, 52 . . . crystal orientation control layer, 17, 18, 57, 58, 67, 68, 118 . . . power supply, 19, 59, 69, 119 . . . signal detector, 21, 81, 15 121 . . . multi-layer, 22, 82, 122 . . . direction of magnetization (of a magnetic layer with magnetization fixed), 23, 84, 123 . . . direction of magnetization (when an external magnetic field of a magnetic layer magnetized and rotated is not present), 24, 124 . . . detecting direction of 20 external magnetic field, 25, 85, 125 . . . direction of magnetization (when an induction magnetic field of a magnetic layer magnetized and rotated), 26, 27, 87, 88, 126, 127 . . . direction of magnetization (when an external magnetic field of a magnetic layer magnetized and rotated 25 is present), 28, 71, 128 . . . magnetic recording medium, 72 . . . magnetic recording medium driving force, 73 . . . magnetic head, 74 . . . magnetic head driving force, 75 . . . recording and playback signal processing system, 83 . . . direction of external magnetic field, 86 . . . magnetic field generating mechanism, 94, 95, 96, 97 . . . current applying and measuring system, 112 . . . hard magnetic layer, 114, 116 . . . soft magnetic layer.

As described above, the basis of the present invention lies in that a multi-layer having two or three magnetic layers separated by an insulating layer is used, an induction magnetic field is applied to a magnetic layer in which magnetization is rotated by an external magnetic field, and the induction magnetic field applied to the magnetic field is offset by a leakage magnetic field from the magnetic layer in which magnetization is fixed whereby magnetization of the magnetic layer is substantially perpendicular to the magnetic field applying direction. Accordingly, a magneto-resistive element excellent in symmetry of playback waveforms was obtained. Further, a magnetic head, a magnetic recording and playback apparatus and a magnetic memory, which are excellent in symmetry of playback waveforms could be obtained by the magneto-resistive element.

What is claimed is:

1. A magnetic head having a magneto-resistive element, said magneto-resistive element comprising:

a substrate, a multi-layer having at least a first magnetic layer, an insulating layer, and a second magnetic layer laminated on said substrate, an anti-ferromagnetic layer being formed on a lower or upper of said multi-layer, a first voltage supplier applying a voltage between the first magnetic layer and the second magnetic layer;

a direction of magnetization of one magnetic layer selected from a group of the first and the second magnetic layers being substantially parallel or counter-parallel with a detecting direction of an external magnetic field;

a direction of magnetization of the other magnetic layer, which is not substantially parallel or counter-parallel with the detecting direction of the external magnetic field, being changeable by said external magnetic field, a second voltage supplier for causing a current to flow in at least one conductive layer selected from a group of layers laminated on said substrate in a direction crossing a laminating direction of said multi-layer and perpendicular to the external magnetic field and making a direction of magnetization of the other magnetic layer, which is changeable by said external magnetic field, substantially perpendicular to the detecting direction of the external magnetic field when the external magnetic field is not present, and a detector detecting, when the direction of magnetization of the other magnetic layer is changed by the external magnetic field, a change of current tunneling through the insulating layer caused thereby.

2. A magnetic head according to claim 1, wherein a non-magnetic metal layer is formed on said multi-layer.

3. A magnetic head according to claim 1, wherein said multi-layer is formed on said substrate, and said anti-ferromagnetic layer is formed on said multi-layer.

4. A magnetic head according to claim 3, wherein at least one layer selected from a group of a crystal orientation layer and a non-magnetic metal layer is formed between said multi-layer and said substrate.

5. A magnetic head according to claim 4, wherein said second voltage supplier is also for causing a current to flow in at least one conductive layer selected from a group of layers laminated on said substrate in a direction crossing a laminating direction of said multi-layer and perpendicular to the detecting direction of the external magnetic field.

* * * * *